United States Patent
Edmonds et al.

(10) Patent No.: US 11,963,288 B2
(45) Date of Patent: Apr. 16, 2024

(54) THERMAL MODULE FOR A CIRCUIT BOARD

(71) Applicant: Apple Inc., Cupertino, CA (US)

(72) Inventors: Trevor J. Edmonds, San Francisco, CA (US); Jay S. Nigen, Los Gatos, CA (US); Richard D. Kosoglow, San Jose, CA (US); Ron A. Hopkinson, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/843,884

(22) Filed: Jun. 17, 2022

(65) Prior Publication Data
US 2023/0413416 A1    Dec. 21, 2023

(51) Int. Cl.
*H05K 1/02* (2006.01)
*G06F 1/20* (2006.01)
*H05K 7/20* (2006.01)

(52) U.S. Cl.
CPC .......... *H05K 1/0203* (2013.01); *G06F 1/203* (2013.01); *H05K 7/2039* (2013.01); *H05K 2201/10128* (2013.01)

(58) Field of Classification Search
CPC .............. H05K 1/0203; H05K 7/2039; H05K 2201/10128; G06F 1/203
See application file for complete search history.

(56) References Cited

U.S. PATENT DOCUMENTS

| | | | |
|---|---|---|---|
| 4,730,232 A | 3/1988 | Lindberg | |
| 5,184,283 A | 2/1993 | Hamel | |
| 5,459,640 A * | 10/1995 | Moutrie | H01L 23/4006 |
| | | | 361/825 |
| 5,729,431 A * | 3/1998 | Marwah | G06F 1/203 |
| | | | 257/713 |
| 5,737,187 A * | 4/1998 | Nguyen | G06F 1/203 |
| | | | 361/679.55 |
| 5,784,256 A * | 7/1998 | Nakamura | H05K 1/0204 |
| | | | 361/679.55 |
| 5,875,095 A * | 2/1999 | Webb | G06F 1/203 |
| | | | 361/679.52 |

(Continued)

FOREIGN PATENT DOCUMENTS

GB         2616072 A  *  8/2023  ............ B25B 11/02

*Primary Examiner* — Michael A Matey
(74) *Attorney, Agent, or Firm* — BAKERHOSTETLER

(57) ABSTRACT

An assembly for heat-generating components includes a metal and a non-metal layer. To secure to a circuit board that carries a heat-generating component, a metal standoff is secured on a perimeter of the circuit board. Multiple protruding elements of the metal layer of the assembly secure within a respective opening of the standoff. The assembly secures, through metal-to-metal contact, to the standoff by multiple mechanical couplings. The assembly not only covers the circuit board, but also extends laterally beyond the circuit board (and the circuit board components). As a result, the assembly receives thermal energy from a heat-generating component(s) on the circuit board and allows the thermal energy to flow through assembly from one portion of the assembly covering the heat-generating component(s) to the lateral portion of the assembly that does not cover the heat-generating component(s).

25 Claims, 14 Drawing Sheets

(56) References Cited

U.S. PATENT DOCUMENTS

| | | | |
|---|---|---|---|
| 5,930,115 A * | 7/1999 | Tracy | H05K 7/20727 |
| | | | 361/689 |
| 6,078,359 A | 6/2000 | Conder | |
| 6,362,978 B1 * | 3/2002 | Boe | G06F 1/184 |
| | | | 248/65 |
| 6,547,571 B2 * | 4/2003 | Allen | G01R 31/2808 |
| | | | 439/74 |
| 7,113,406 B1 * | 9/2006 | Nguyen | H01L 23/552 |
| | | | 257/E23.114 |
| 7,787,251 B2 | 8/2010 | Bailey | |
| 7,925,902 B1 * | 4/2011 | Radcliffe | G06F 1/206 |
| | | | 702/132 |
| 9,913,356 B2 | 3/2018 | Rostamzadeh et al. | |
| 2002/0008963 A1 * | 1/2002 | DiBene, II | H05K 3/368 |
| | | | 361/720 |
| 2004/0042182 A1 * | 3/2004 | Barsun | H05K 7/1487 |
| | | | 361/752 |
| 2005/0068740 A1 * | 3/2005 | Ulen | H01L 23/4006 |
| | | | 257/E23.087 |
| 2006/0139878 A1 * | 6/2006 | Widmayer | H05K 7/20918 |
| | | | 361/695 |
| 2013/0050954 A1 * | 2/2013 | Albrecht, III | H05K 7/20454 |
| | | | 361/720 |
| 2016/0174378 A1 * | 6/2016 | Johnson | H05K 1/148 |
| | | | 29/830 |
| 2020/0084310 A1 * | 3/2020 | Keen | H01M 50/284 |
| 2020/0100353 A1 * | 3/2020 | Tanaka | H05K 5/0043 |
| 2021/0015007 A1 * | 1/2021 | Watanabe | H05K 7/20481 |
| 2022/0015260 A1 * | 1/2022 | Uchino | H05K 7/2039 |
| 2023/0337406 A1 * | 10/2023 | Bawa | H05K 7/20336 |
| | | | 361/695 |

\* cited by examiner

THERMAL MODULE FOR A CIRCUIT BOARD

TECHNICAL FIELD

The present disclosure is directed to a module for a circuit board and components on the circuit board, and more particularly, to a module that provides an electromagnetic interference (EMI) shield, a protective cover, and a thermal energy dissipator for the components located on the circuit board.

BACKGROUND

Electronic devices include circuit boards that carry several operational components, such as integrated circuits. Some circuit boards are covered by a structure having approximately the same dimensions as those of the circuit board. Also, these structures can be used to extract thermal energy from the integrated circuits.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
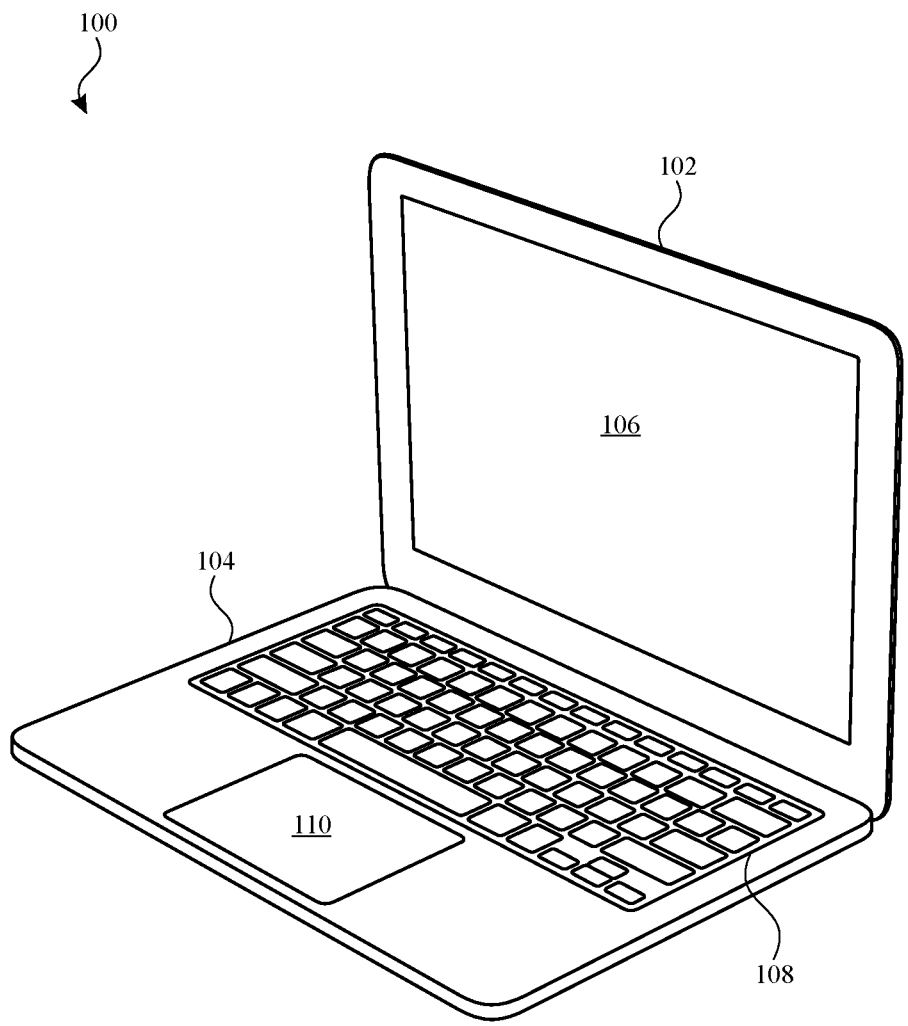
FIG. 1 illustrates a perspective view of an electronic device, in accordance with some aspects of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The present disclosure is directed to assemblies for circuit boards used in electronic devices. Assemblies described herein may refer to cover assemblies that include one or more structural components used to cover a circuit board, including components of the circuit board. An assembly may include one or more layers of materials for thermal energy spreading and dissipation. These layers may include both metals and non-metals. A metal layer of a cover assembly can not only provide thermal benefits, but can also shield components (e.g., integrated circuits) from EMI generated from other components in the electronic device. Moreover, the metal layer can limit or prevent EMI generated by a component(s) on the circuit board from reaching sensitive components not located on the circuit board (e.g., antennas).

While traditional structures are generally used to shield the circuit board components, these structures often lack in other aspects. For example, in order to reduce the overall weight of the structure, adhesives and tapes are used as the basis for the circuit board cover. However, over time, adhesives and tapes may break down and fail to withstand external loads received by the electronic device.

Assemblies described herein provide a robust housing designed to withstand external loads exerted on the electronic device. For example, the assembly is designed to secure/mate with a metal standoff, or fence, that is secured with a perimeter to the circuit board. Generally, the metal standoff is secured along a perimeter of the circuit board. In particular, the metal layer is modified to include several protruding elements that secure with respective openings, or voids, in the standoff, thus forming multiple mechanical couplings. By forming a direct, metal-to-metal contact between the cover assembly and the standoff, the force required to remove the cover assembly may significantly increase over that of adhesive or tape (i.e., no direct metal-to-metal coupling), while also removing the need for additional materials, such as adhesive or tape. However, an adhesive or tape may be used in some embodiments. Beneficially, such assemblies can be integrated into portable electronic devices, such as laptop computing device, and in particular, next to a keyboard of the laptop computing, i.e., a location in which external loads are regularly received when the keyboard is in use.

While the standoff generally traces around a perimeter/border of the circuit board, the assembly can extend beyond the standoff and the circuit board. For example, the assembly includes one portion that covers the circuit board, as well as another portion that extends beyond the standoff and the circuit board, and accordingly, does not cover the circuit board. The extended portion can be used as a heat sink or a fin. For example, during operation of one or more heat-generating components (e.g., integrated circuits) located on the circuit board, the portion covering the circuit board can extract thermal energy generated by the heat-generating component(s). The extracted thermal energy can flow to the portion not covering the circuit board, where it is dissipated over time. As a result, the thermal energy is not only extracted from the heat-generating component(s), but also flows laterally away from the heat-generating component(s), thus keeping the assembly in proximity to the heat-generating component(s) relatively cool.

Additionally, the standoff is modified to include several openings. In this manner, the standoff can receive fasteners, in respective openings of the standoff, that secure a cowling, or cover, that secures a connector to the circuit board. As a result, the space on the circuit board dedicated to components increases as the standoff can hold the fasteners, as opposed to using several bosses on the circuit board. Put another way, the component density on the circuit board may increase as a result of the standoff modifications. Additionally, based on the design of the metal layer of the circuit board and the location of the openings, a fastener head of a fastener contacts both the metal layer and the standoff (including a portion of the standoff other than the opening). Beneficially, when the fastener and cowling are removed, the connector is readily accessible while the circuit board remains generally covered. This may reduce serviceability times.

These and other embodiments are discussed below with reference to FIGS. 1-15. However, those skilled in the art will readily appreciate that the detailed description given herein with respect to these Figures is for explanatory purposes only and should not be construed as limiting.

According to some embodiments, for example as shown in FIG. 1, an electronic device 100 includes a display housing 102 and a base portion 104. Display housing 102 is rotationally coupled to base portion 104, and vice versa, thus allowing display housing 102 to rotate toward and away from base portion 104 from an open position (shown in FIG. 1) to a closed position in which display housing 102 covers base portion 104.

Display housing 102 includes a display 106 designed to present visual information in the form of textual information, still images (e.g., pictures), and/or motion images (e.g., video). Base portion 104 includes multiple input mechanisms, such as a keyboard 108 and a track pad 110. Although not shown, base portion 104 (or in some cases, display housing 102) carries multiple components, such as a central processing unit (CPU), a graphics processing unit (GPU), a system on a chip (SOC), an application specific integrated circuit (ASIC), a memory circuit, and flexible circuitry, as non-limiting examples.

Figure 2:
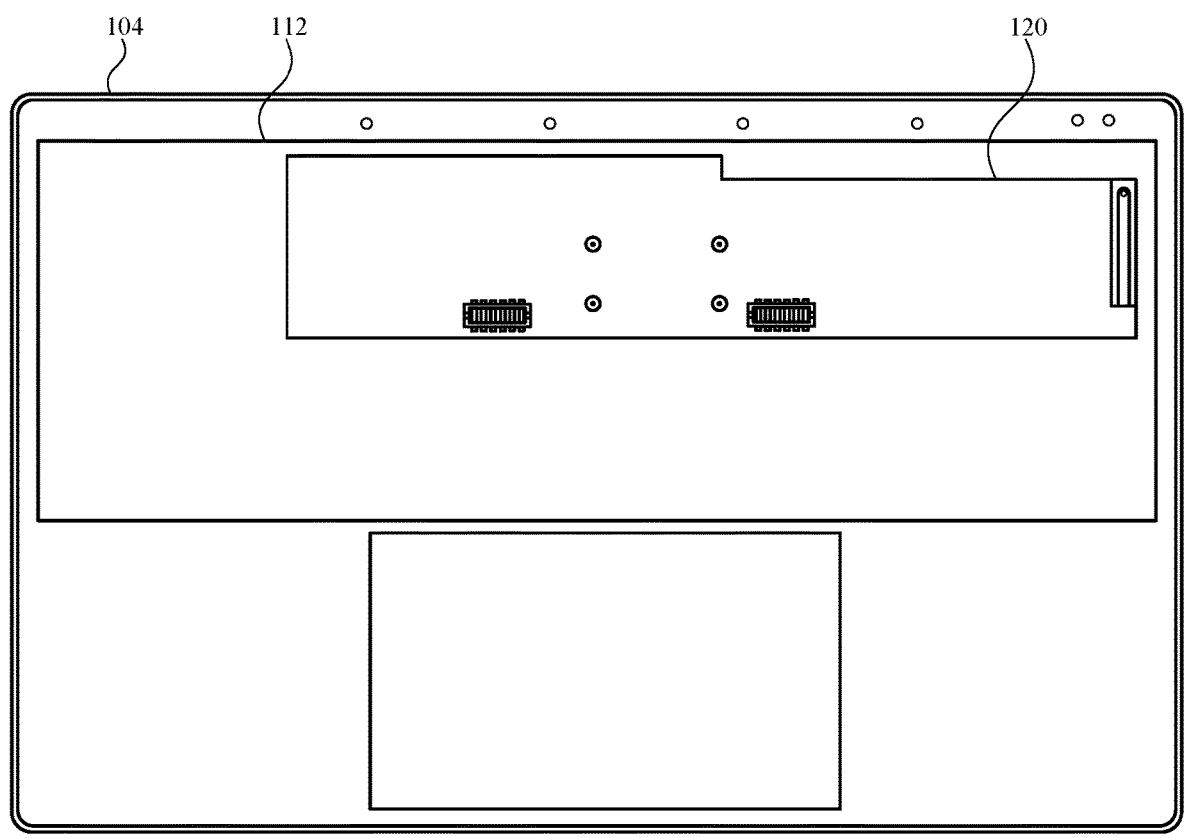
FIG. 2 illustrates a plan view of an electronic device, showing internal features of the electronic device, in accordance with some aspects of the present disclosure.

Referring to FIG. 2, an internal view of base portion 104 shows a circuit board 112 for keyboard 108 (shown in FIG. 1) and assembly 120 located on circuit board 112, which may also be referred to as a keyboard circuit board. For purposes of illustration, a housing component is removed from base portion 104 to show an internal chamber, or volume, in which circuit board 112 and assembly 120 are located. Assembly 120 is disposed over an additional circuit board (not shown in FIG. 2) that carries one or more of a CPU, a GPU, a SOC, and an ASIC. As a result of its relative position, assembly 120 can act as a cover assembly designed to provide thermal, structural, and electrical ground benefits for some circuit boards.

Figure 3:
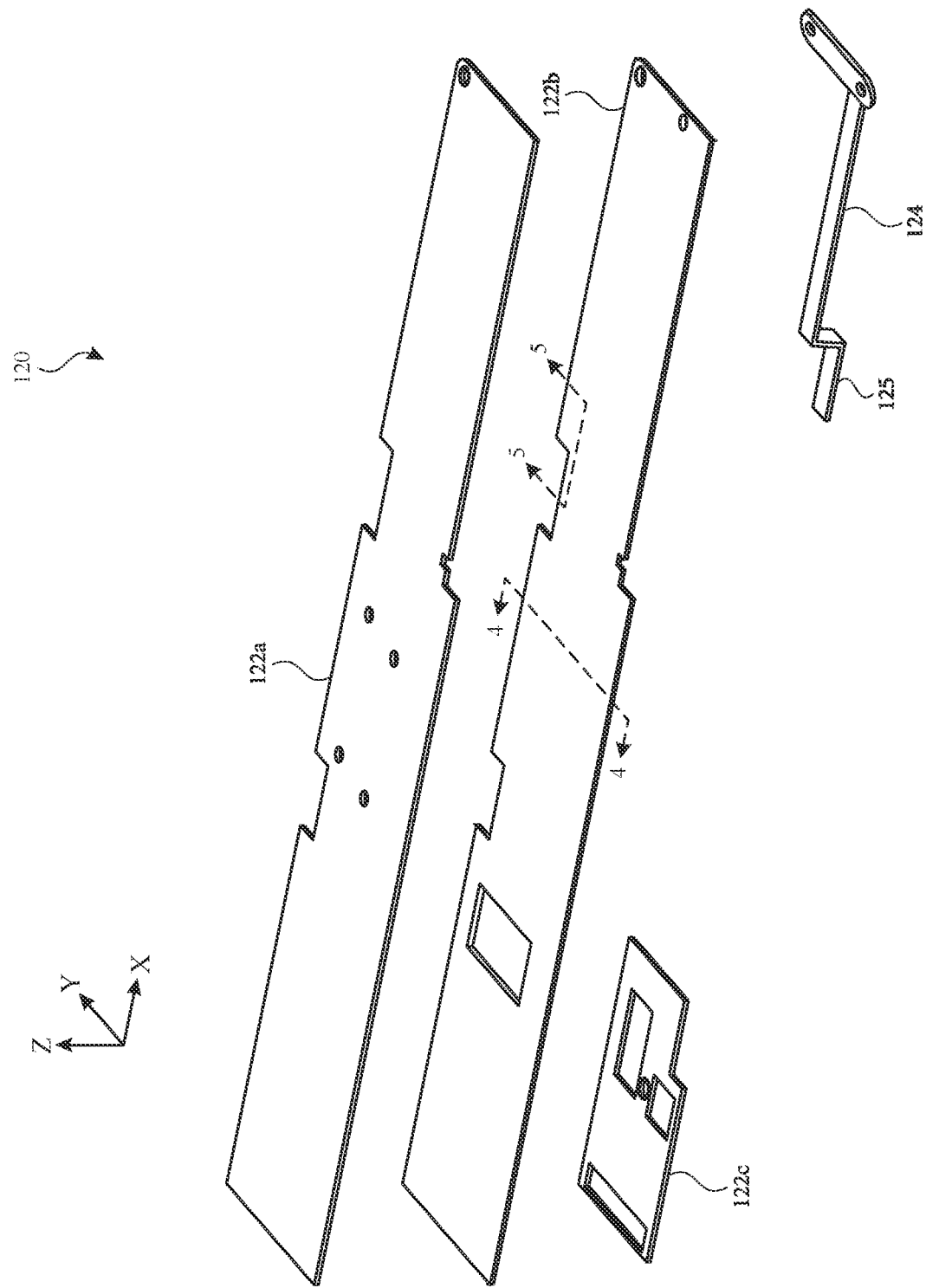
FIG. 3 illustrates an exploded view of an assembly, in accordance with some aspects of the present disclosure.

Referring to FIG. 3, assembly 120 includes several components. For example, assembly 120 includes a layer 122a, a layer 122b, and a layer 122c. Layer 122a may include a non-metal material or multiple non-metal materials, such as graphite, biaxially-oriented polyethylene terephthalate (Bo-PET, also known as mylar), or a combination thereof. Generally, layer 122a may include a material, or combination of materials, that includes a relatively high thermal conductivity, thus allowing layer 122a to readily receive, transport, and spread thermal energy based on a temperature gradient.

Layer 122b may include a metal material or multiple metal materials. For example, layer 122b may include copper or copper alloy. The material(s) selected for layer 122b may include one or more metals with a relatively high thermal conductivity, thus allowing layer 122b to not only receive and transport received thermal energy laterally (along X- and Y-axes in Cartesian coordinates), but also provide at least some of the received thermal energy to layer 122a. Additional modifications to layer 122b are possible. For example, layer 122b may include an embossed region defined by an indentation that receives layer 122a. Additionally, layer 122b may be manipulated to include elongated features along a perimeter of layer 122b. These features will be further shown and described below.

Layer 122b may further provide additional protection to a circuit board (and its components). For example, the material makeup of layer 122b can stiffen a circuit board and limit or prevent some flexing of the circuit board due to external loads applied to the electronic device in which the circuit board is located. As a result, the components of circuit board are less likely to decouple, including electrically decouple, from the circuit board.

Further, based on the material makeup, layer 122b provides an EMI shield that blocks noise from components in the electronic device that are external to the circuit board covered by assembly 120. Moreover, layer 122b may prevent EMI generated from components on the circuit board from emanating throughout the electronic device.

Layer 122c includes an insulating layer, including an electrically insulating layer. Layer 122c is positioned on a surface of layer 122b such that layer 122c is positioned between layer 122b and an electrical component(s) (e.g., integrated circuit(s)). In this manner, the clearance, or space, between layer 122b and the electrical component(s) can be relatively small without the electrical component(s) coming into direct contact with layer 122b, thus preventing unwanted electrical discharge.

Also, assembly 120 may include a bracket 124 that acts as a stiffening element for assembly 120. In some instances, at least one of the dimensions of assembly 120 is greater than that of the circuit board. As a result, when assembly 120 is installed over a circuit board, assembly 120 extends laterally beyond the circuit board. In order to support this laterally extended portion, bracket 124 connects to assembly 120 (at layer 122b) and further connects with the circuit board 112 (shown in FIG. 2). In order to secure with components in different dimensions along the Z-axis, bracket 124 may include a bend 125, with bend 125 formed by bending, embossing, or otherwise deforming bracket 124.

Figure 4:
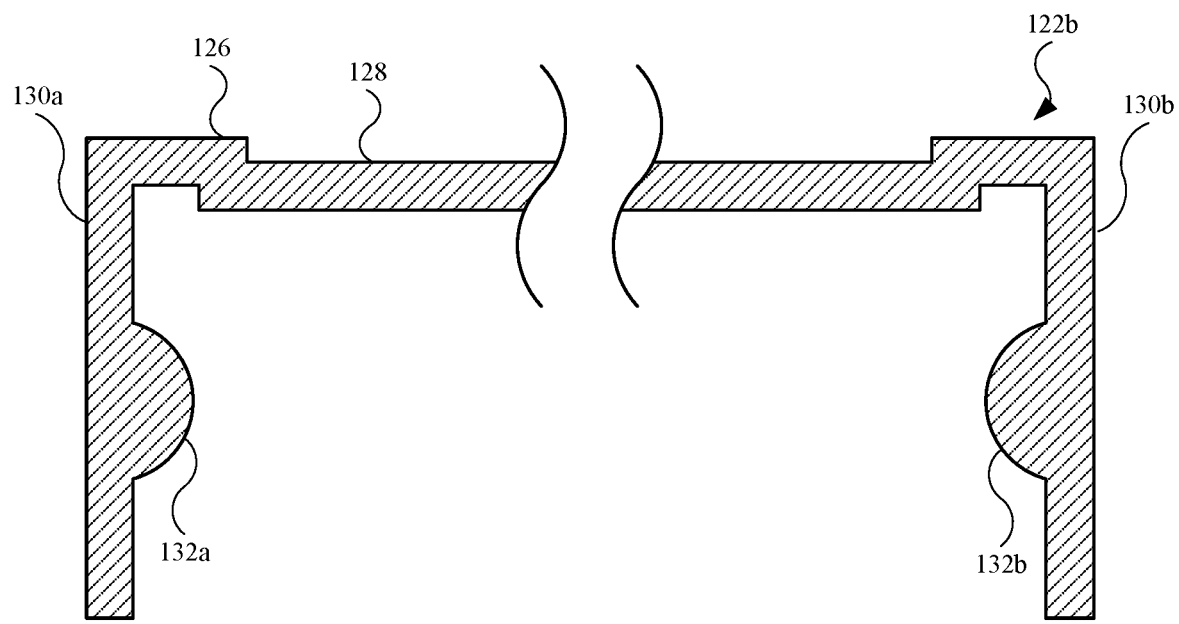
FIG. 4 illustrates a cross-sectional view of the metal layer, taken along line 4-4 of FIG. 3, in accordance with some aspects of the present disclosure.

Referring to FIG. 4, a cross-sectional view of layer 122b, taken along line 4-4 of FIG. 3 shows additional features. In order to receive layer 122a (shown in FIG. 3), a top portion 126 of layer 122b includes an indentation 128 that forms a receiving surface for layer 122a. Indentation 128 may be formed through an embossing operation, a die press operation, or the like. Through an additional operation, layer 122b can be bent or otherwise deformed at the perimeter to form extensions. For example, layer 122b may include an extension 130a and an extension 130b, each of which extend from top portion 126. Also, extensions 130a and 130b may include several protruding elements. For example, extensions 130a and 130b include protruding elements 132a and 132b, respectively. Protruding elements 132a and 132b (representative of several additional indentations) extend inwardly from extensions 130a and 130b, respectively, and act as coupling features that allow layer 122b to mechanically connect to another structure. This will be shown and described below.

Figure 5:
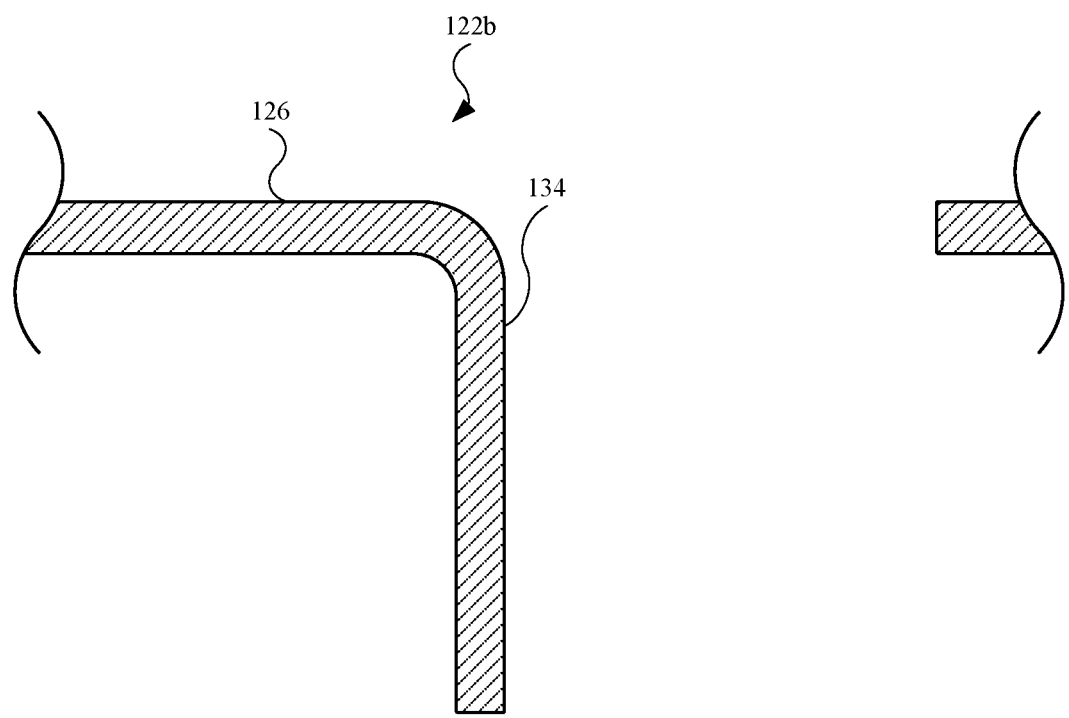
FIG. 5 illustrates a cross-sectional view of the metal layer, taken along line 5-5 of FIG. 3, in accordance with some aspects of the present disclosure.

Referring to FIG. 5, a cross-sectional view of the layer 122b, taken along line 5-5 of FIG. 3, shows additional features. As shown, layer 122b can undergo an operation (e.g., cutting and bending operation) to form an extension 134 that extends from top portion 126 of layer 122b. Extension 134 (representative of several additional extensions) provides an additional portion of layer 122b that extends from top portion 126. Based on the position of extension 134 (and several similar extensions), layer 122b can provide additional EMI shielding for components on a circuit board and prevent emanation of EMI from the components on the circuit board. While extension 134 (and several similar extensions) form voids in layer 122b, the size and shape of extension 134 (and several similar extensions) does not substantially prevent thermal energy transfer through top portion 126 of layer 122b.

Figure 6:
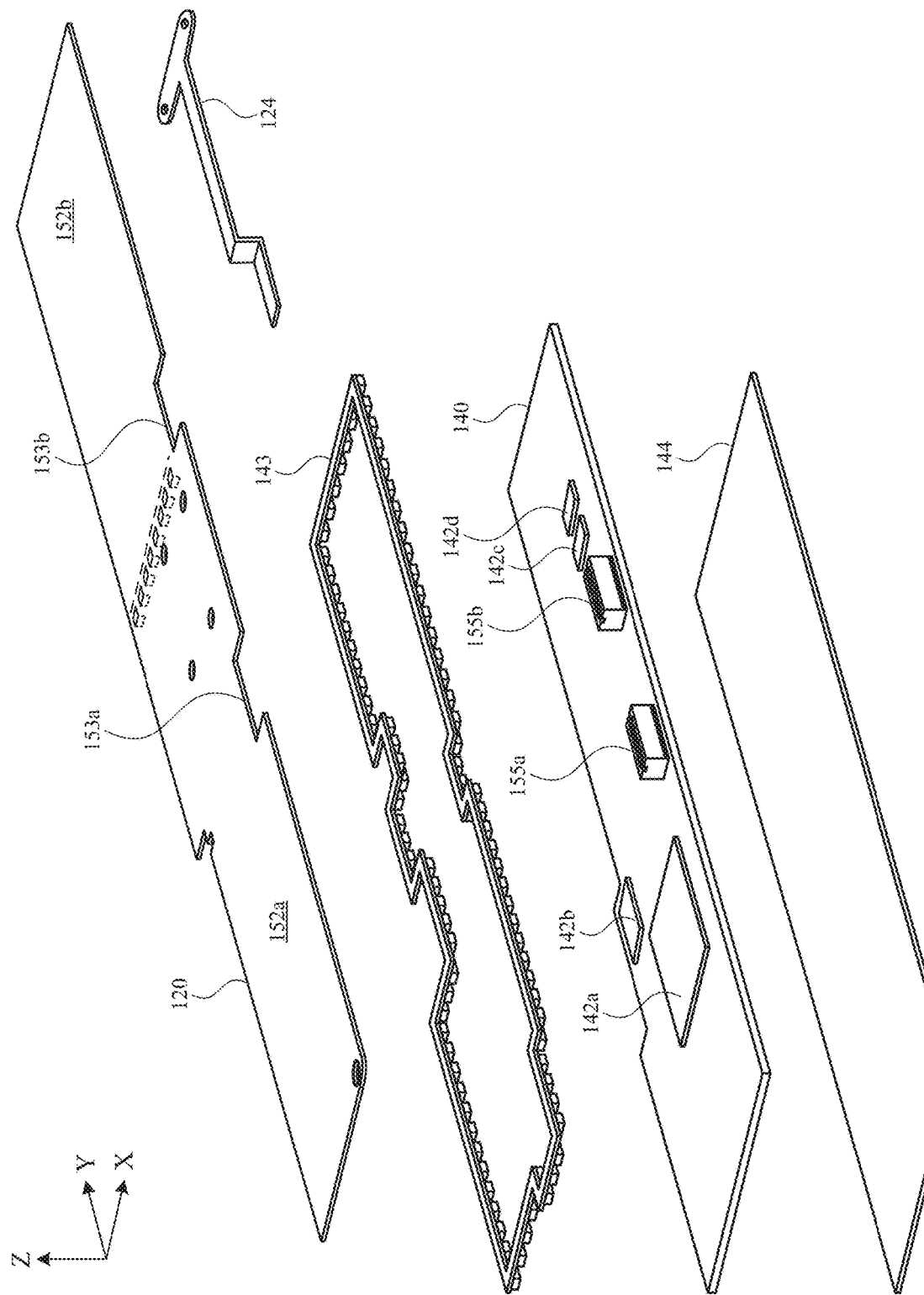
FIG. 6 illustrates an exploded view of an assembly of multiple components that support a circuit board, in accordance with some aspects of the present disclosure.

Referring to FIG. 6, assembly 120 is designed for use with a circuit board 140. As shown, circuit board 140 carries several components, such as a component 142a, a component 142b, and a component 142c. Components 142a, 142b, 142c and 142d are representative of several additional components, including operational components, and each may take the form of a CPU, GPU, ASIC, and/or a SOC, as non-limiting examples. During operation, components 142a, 142b, 142c and 142d may generate thermal energy, and thus may each be referred to as a heat-generating component.

In order to secure assembly 120 with circuit board 140, a standoff 143 is positioned between assembly 120 and circuit board 140. Standoff 143 generally traces a perimeter of circuit board 140, and thus may be referred to as a perimeter standoff. Standoff 143 is secured with circuit board 140 and is further secured with assembly 120, and in particular, with layer 122b (shown in FIG. 3).

Referring again to layer 122b, layer 122b may include a combination of extensions located along a perimeter of layer 122b. For example, at least three sides of layer 122b, a generally 4-sided structure, may include one or more extensions similar to extensions 130a and 130b shown in FIG. 4. Additionally, at least one side of layer 122b may include multiple discrete extensions similar to that of extension 134 shown in FIG. 5. As a result, layer 122b and standoff 143 may combine to act as a Faraday cage.

Additionally, a shield 144 is secured with an opposing surface of circuit board 140, i.e., a surface opposite the surface on which components 142a, 142b, 142c and 142d are positioned. Shield 144 may act as a thermal shield, a structural/protective shield, and/or an EMI shield.

Generally, circuit board 140 and standoff 143 include the same two-dimensional area. However, assembly 120 may include a larger two-dimensional area. For example, assembly 120 includes a major dimension that is greater than a respective major dimension of circuit board 140, standoff 143, and shield 144. The phrase "major dimension" refers to a dimension of greatest length a structure, as compared to the remaining lengths of the structure. As shown in FIG. 6, assembly 120 includes a portion 152a that forms a two-dimensional area that is approximately the same as that of each of circuit board 140 and standoff 143. Additionally, assembly 120 includes a portion 152b that extends laterally relatively to circuit board 140 and standoff 143, and also extends laterally relative to shield 144. Portions 152a and 152b may be referred to as a first portion and a second portion, respectively. However, "first" and "second" may be interchanged. The dotted line on assembly 120 represents an approximate border that separates portion 152a from portion 152b. While portion 152a is secured with standoff 143, portion 152b is supported by bracket 124. Accordingly, when assembled, bracket 124 secures with assembly 120 at portion 152b and secured with circuit board 112 (shown in FIG. 2), and lies outside of, or lateral to, circuit board 140 and standoff 143.

Also, when assembled, the components shown in FIG. 6 combine to form a circuit board assembly. Put another way, a circuit board assembly may include assembly 120, bracket 124, standoff 143, circuit board 140, and shield 144.

Some modifications to assembly 120 are made to accommodate circuit board 140. For example, assembly 120 includes a cut out region 153a and a cut out region 153b to accommodate a connector 155a and a connector 155b, respectively, of circuit board 140. Connectors 155a and 155b may electrically connect components of circuit board 140 to other components (e.g., speaker modules, microphones, wireless communication components, and power sources, as non-limiting examples. Although not explicitly shown, assembly 120 may include other modifications (e.g., cut outs) to accommodate other components, such as onboard wireless communication components.

Figure 7:
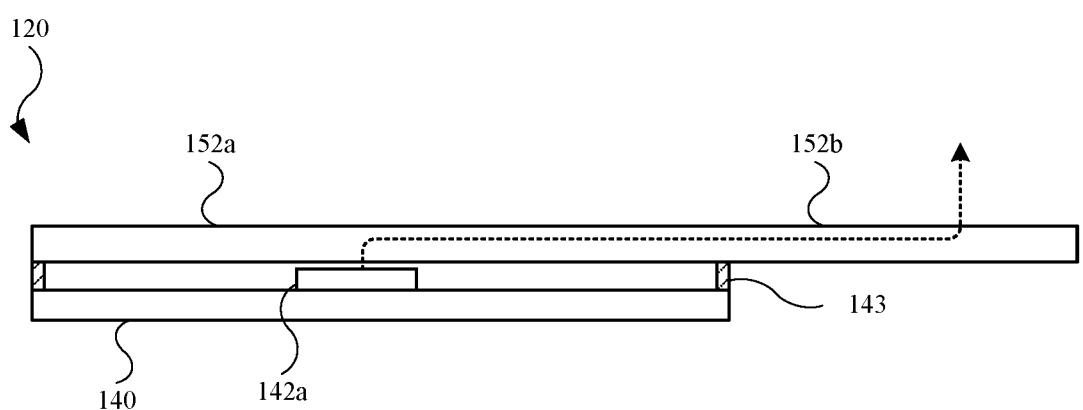
FIG. 7 illustrates a side view of the assembly directing thermal energy away from a heat-generating component, in accordance with some aspects of the present disclosure.

Referring to FIG. 7, assembly 120 is secured with circuit board 140 via standoff 143, which is shown as a partial cross section. During operation, component 142a generates thermal energy. The path of the thermal energy is shown as a dotted line. As shown in FIG. 7, assembly 120 receives the thermal energy at portion 152a of assembly 120. The thermal energy then travels in a perpendicular, or generally perpendicular manner, through assembly 120 from portion 152a to portion 152b. By receiving thermal energy at portion 152b, assembly 120 can store the thermal energy in a location away from component 142a as well as other components of circuit board 140, as portion 152b is laterally positioned relative to circuit board 140. Put another away, circuit board 140 is uncovered by portion 152b and thus circuit board 140 is unaffected by the thermal energy received at portion 152b. In this manner, portion 152b may act as a heat sink for assembly 120 by receiving thermal energy and subsequently dissipating the thermally energy. Although not shown, a thermal gel may be present to facilitate thermal energy transport from component 142a.

Figure 8:
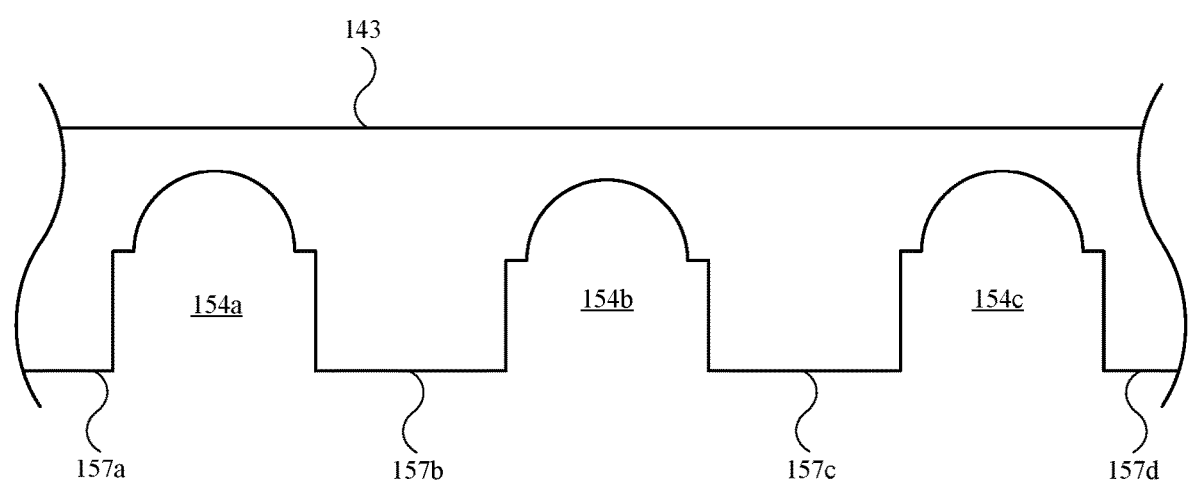
FIG. 8 illustrates a plan view of connection features of a standoff, in accordance with some aspects of the present disclosure.

Referring to FIG. 8, an enlarged view of standoff 143 shows several openings, or voids, between adjacent structures. For example, standoff 143 includes an opening 154a, an opening 154b, and an opening 154c. Standoff further includes an extension 157a, an extension 157b, an extension 157c, and an extension 157d, with opening 154a positioned between adjacent extensions 157a and 157b, opening 154b positioned between adjacent extensions 157b and 157c, and opening 154c positioned between adjacent extensions 157c and 157d. Openings 154a, 154b, and 154c and extensions 157a, 157b, 157c, and 157d are representative of several additional openings and extensions, respectively, of standoff 143. Each of the openings of standoff 143 are designed to receive a protruding element of layer 122b (e.g., protruding elements 132a and 132b, shown in FIG. 4).

Figure 9:
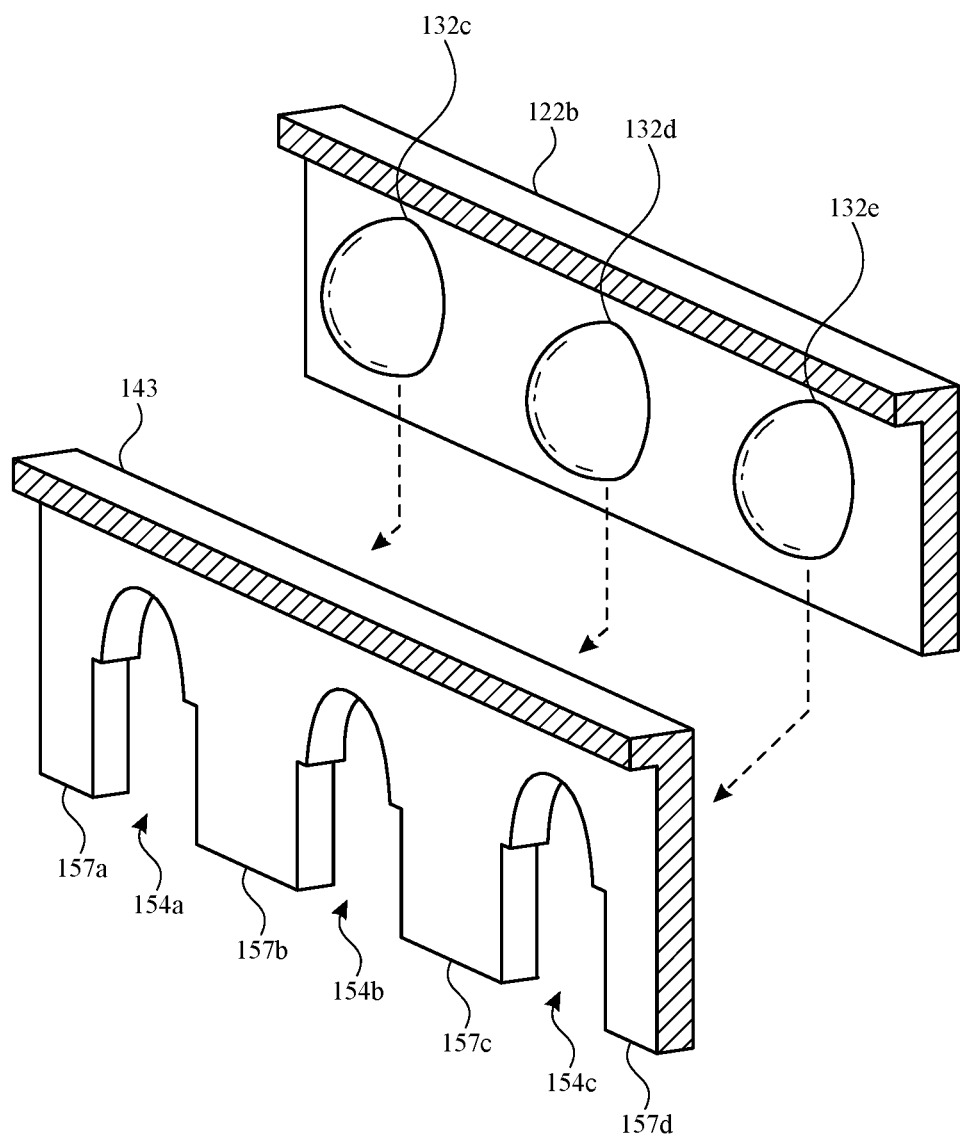
FIG. 9 illustrates a perspective view showing portions of a standoff and a metal layer, including their respective connection features, in accordance with some aspects of the present disclosure.

Referring to FIG. 9, the connection features between layer 122b of assembly 120 (shown in FIG. 6) and standoff 143 are shown. Layer 122b includes protruding elements 132c, 132d, and 132e (each similar to protruding elements 132a and 132b, in FIG. 4). When assembled, protruding elements 132c, 132d, and 132e are positioned in openings 154a, 154b, and 154c, respectively. Accordingly, protruding element 132c is positioned between extensions 157a and 157b, protruding element 132d is positioned between extensions 157b and 157c, and 132e is positioned between extensions 157c and 157d. As a result, assembly 120 (shown in FIG. 6) is mechanically connected (by way of layer 122b) with standoff 143.

Figure 10:
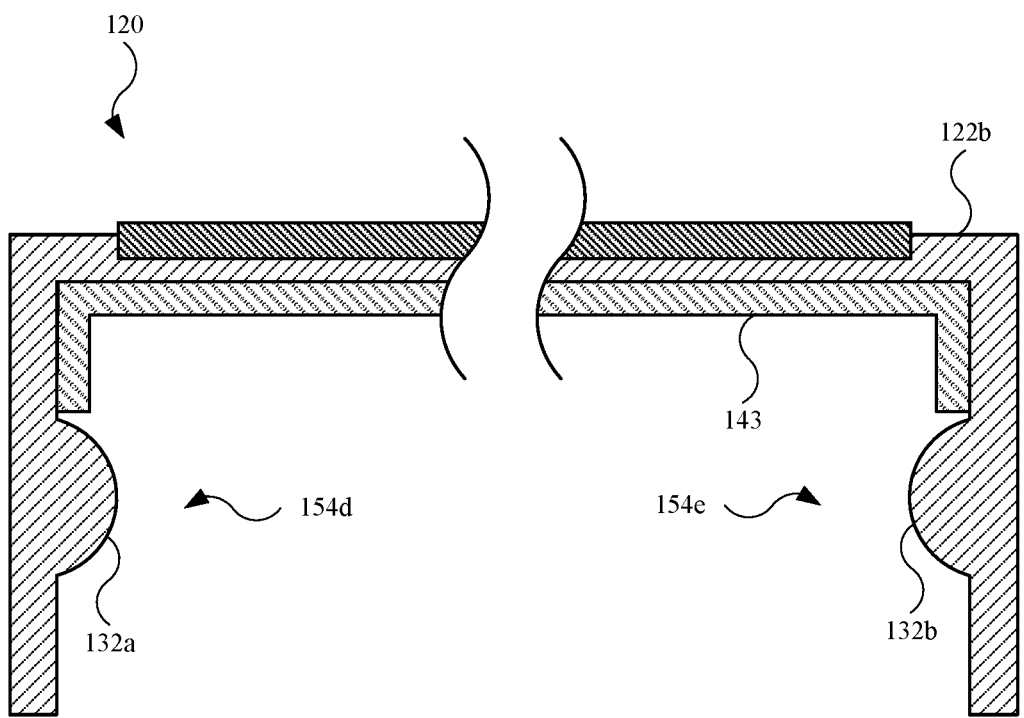
FIG. 10 illustrates a cross-sectional view showing a standoff secured with a metal layer based on their respective connection features, in accordance with some aspects of the present disclosure.

Referring to FIG. 10, assembly 120 is mechanically connected with standoff 143. As shown, layer 122b overlap standoff 143. Additionally, protruding elements 132a and 132b of layer 122b are positioned in openings 154d and 154e, respectively, of standoff 143, and accordingly, between adjacent extensions (not shown in FIG. 10) of standoff 143. Several additional mechanical couplings like those shown in FIG. 10 may be present between layer 122b and standoff 143. As a result, adhesives and/or tape may not be required to secure assembly 120 together with standoff 143. Additionally, layer 122b and standoff 143 are in direct contact with each other, thus providing metal-to-metal contact between the components. Beneficially, this relationship may increase EMI shielding as well as provide a more robust protective cover for circuit board 140 (not shown in FIG. 10).

Figure 11:
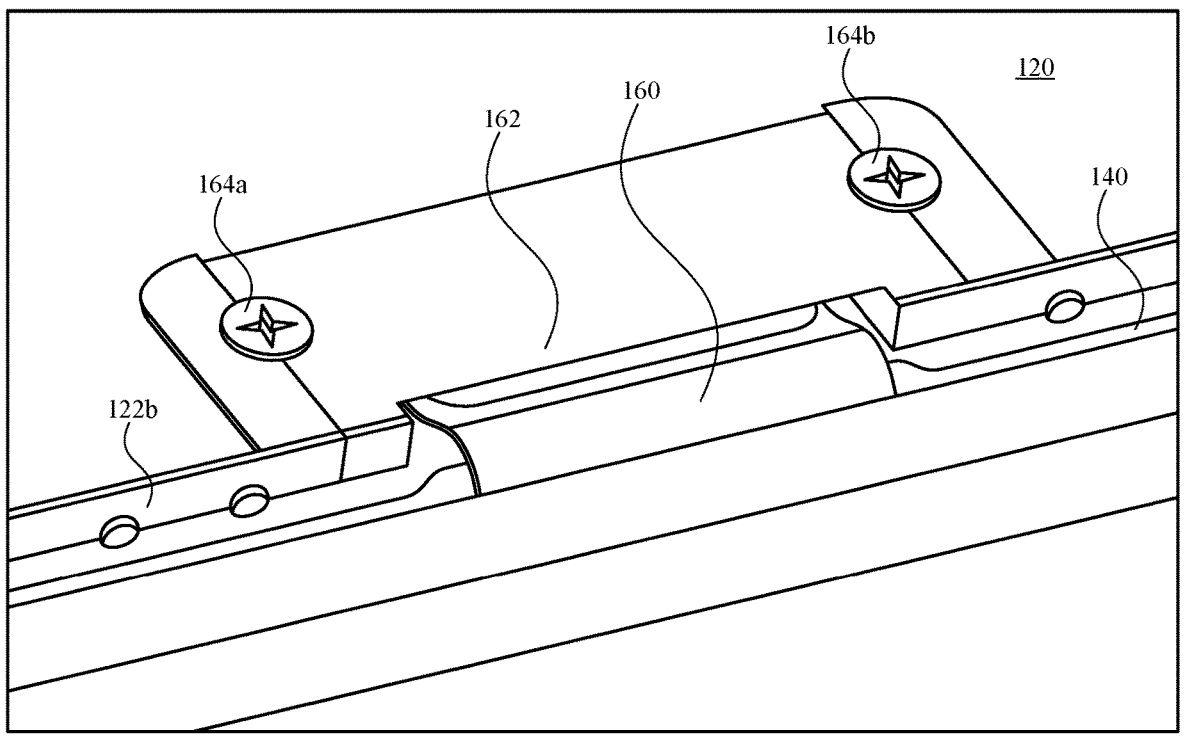
FIG. 11 illustrates a perspective view of a component used to secure a connector to a circuit board, in accordance with some aspects of the present disclosure.

Referring to FIG. 11, assembly 120 is secured with standoff 143 (not shown), and a flexible cable 160 is electrically coupled to a connector (e.g., one of connectors 155a and 155b, shown in FIG. 6) of circuit board 140. In order to secure flexible cable 160, a cowling 162 is secured over flexible cable 160. Additionally, a fastener 164a and a fastener 164b secure cowling 162 to assembly 120. In particular, fasteners 164a and 164b each include a fastener head. As shown in FIG. 11, the respective fastener heads of fasteners 164a and 164b are in contact with both layer 122b and cowling 162.

Based on the cut out region (e.g., cut out regions 153a and 153b) of assembly 120, when cowling 162 and flexible cable 160 are removed to access the connector (to which flexible cable 160 was coupled), circuit board 140 is still substantially covered by assembly 120. Put another way, additional access to circuit board 140 is not required to disconnect other electrical components similar to flexible cable 160. As a result, an electronic device that carries circuit board 140 can be more easily serviced, as circuit board 140 can be easily removed and/or replaced based upon the ease of removing electrical components at the perimeter of circuit board 140.

Figure 12:
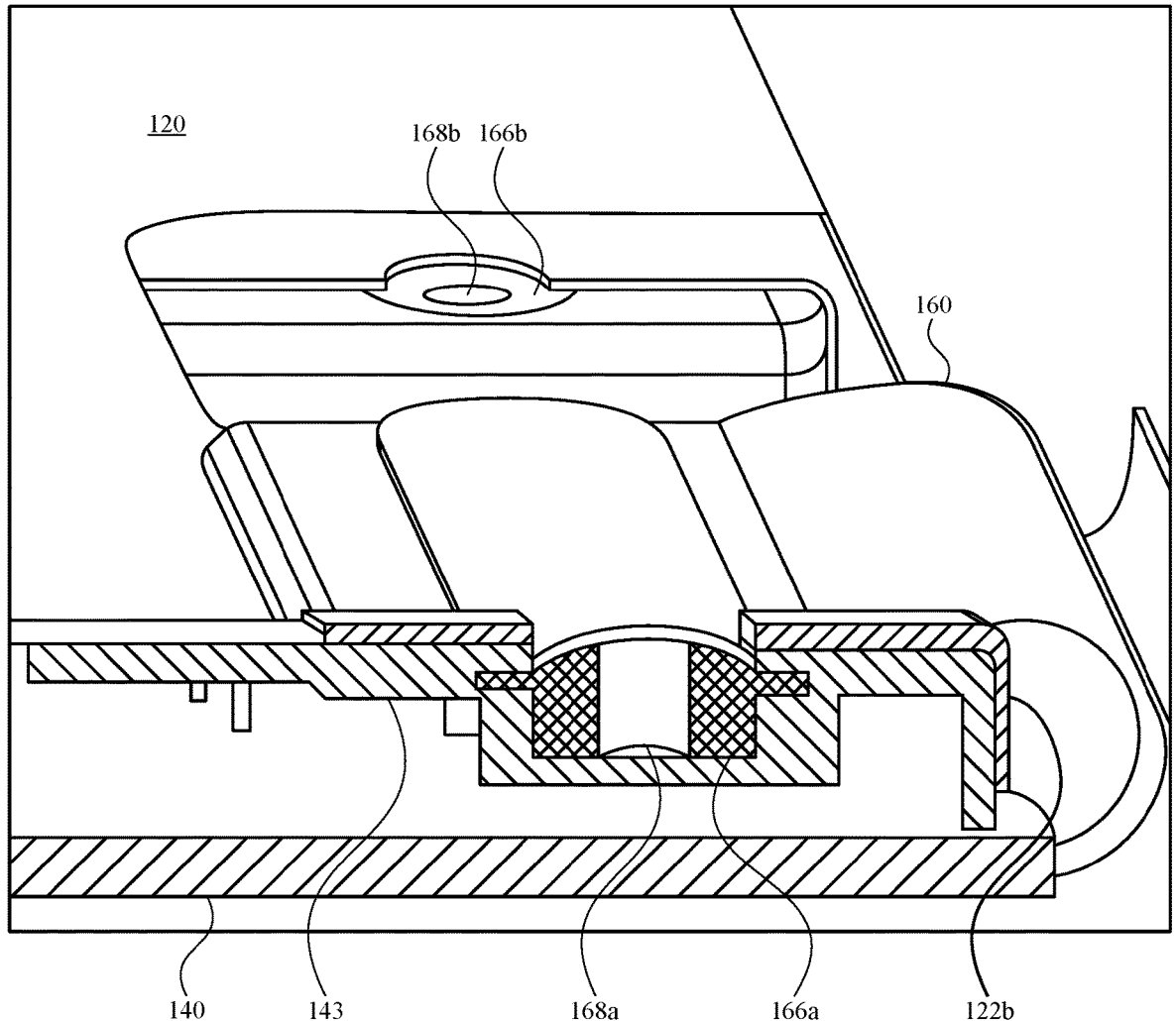
FIG. 12 illustrates a partial cross-sectional view of a standoff, showing modifications of the standoff used to receive fasteners/inserts, in accordance with some aspects of the present disclosure.

Referring to FIG. 12, standoff 143 includes modifications to receive fasteners 164a and 164b (shown in FIG. 11). For purposes of illustration, cowling 162 (shown in FIG. 11) used to secure flexible cable 160 is removed. As shown, standoff 143 includes an insert 166a and an insert 166b.

Further, inserts 166a and 166b include an opening 168a and an opening 168b, respectively. Openings 168a and 168b are designed to receive fasteners 164a and 164b, respectively. In some embodiments, openings 168a and 168b are threaded openings, and fasteners 164a and 164b are threaded fasteners. Beneficially, standoff 143 includes features used to receive fasteners 164a and 164b, rather than standalone features (e.g., cylindrical standoffs) secured directly to circuit board 140. This may result in additional volume between assembly 120 and circuit board 140 for additional operational components, which can in turn lead to an electronic device with additional capabilities.

Figure 13:
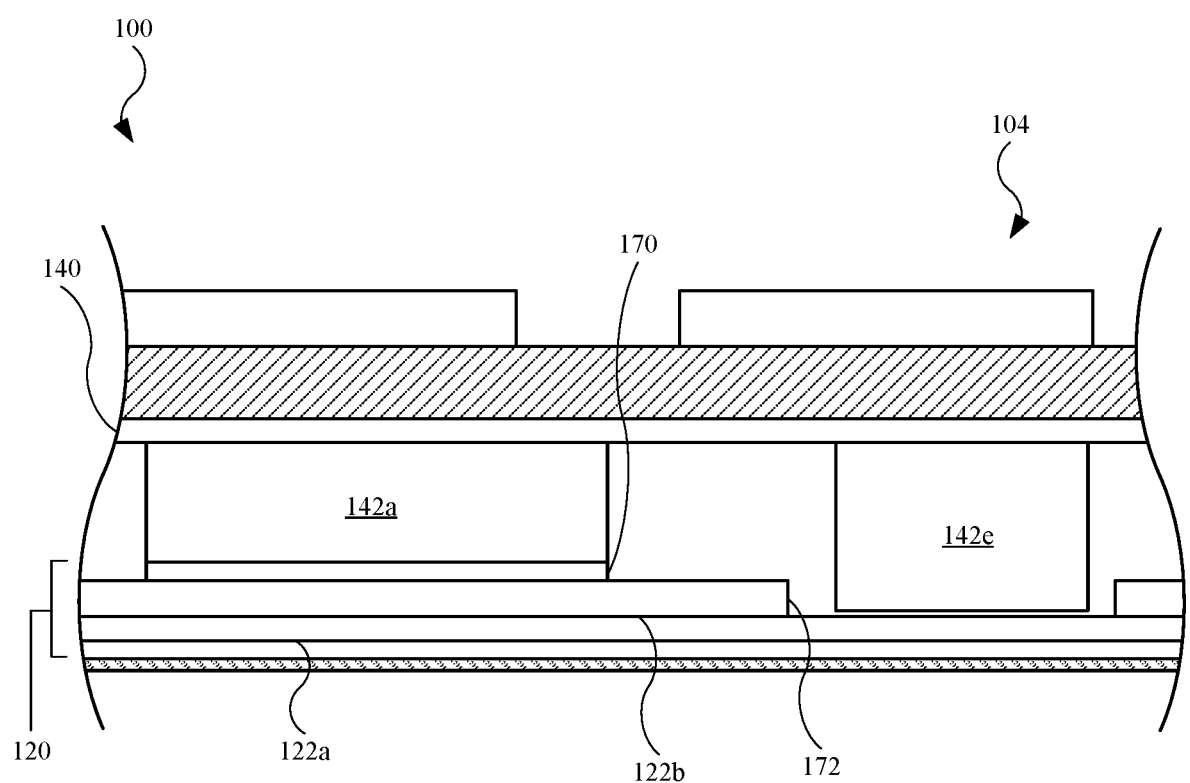
FIG. 13 illustrates a partial cross-sectional view of an electronic device, showing additional thermal features of an assembly, in accordance with some aspects of the present disclosure.

Referring to FIG. 13, a partial cross-section of base portion 104 of electronic device 100 shows additional features used to cool components. For example, assembly 120 includes a gel 170 that engages component 142a and layer 122b of assembly 120. As shown, gel 170 fills a gap or space between component 142a and layer 122b. Gel 170 may include a thermal gel that includes a relatively high thermal conductivity. As a result, thermal energy generated by component 142a can more easily flow into gel 170 and subsequently into layer 122b, as opposed to thermal energy flowing through air.

Additionally, assembly 120 includes an opening 172 positioned in a location corresponding to a component 142e. As shown in FIG. 13, opening 172 is formed in layer 122b, thus allowing component 142e to be positioned on circuit board 140 without contacting assembly 120, as component 142e is tall enough to otherwise contact layer 122b. Accordingly, assembly 120 can be further modified for the components of circuit board 140.

In addition to laptop computing devices, the features shown and described for assembly 120 (including standoff 143) and circuit board 140 can be located in other electronic devices. For example, FIGS. 14A-14D show additional exemplary devices, each of which may include an assembly, a circuit board, and a standoff with any features shown and described for assembly 120, circuit board 140, and standoff 143, respectively. Additionally, each electronic device shown and described in FIGS. 14A-14D may include a housing designed to store an assembly, a circuit board, and a standoff.

Figure 14A:
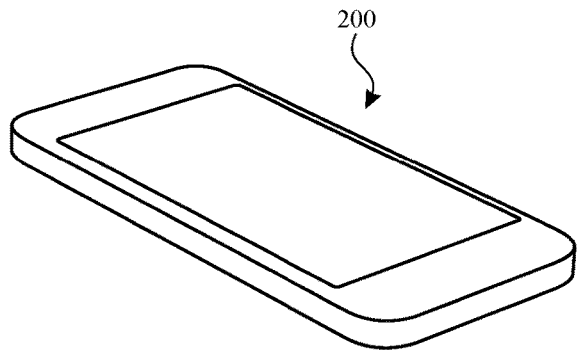
FIGS. 14A, 14B, 14C, and 14D illustrate alternate embodiments of an electronic device, in accordance with some aspects of the present disclosure.
Figure 14B:
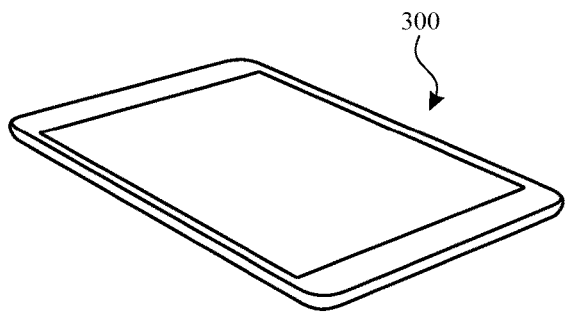
Figure 14C:
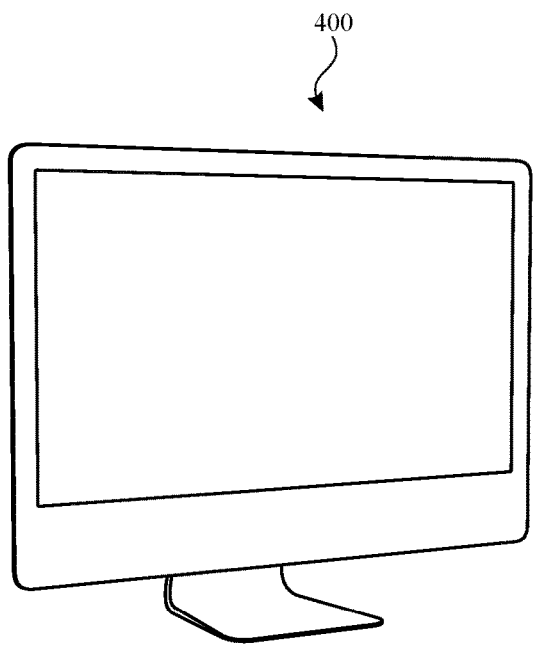
Figure 14D:
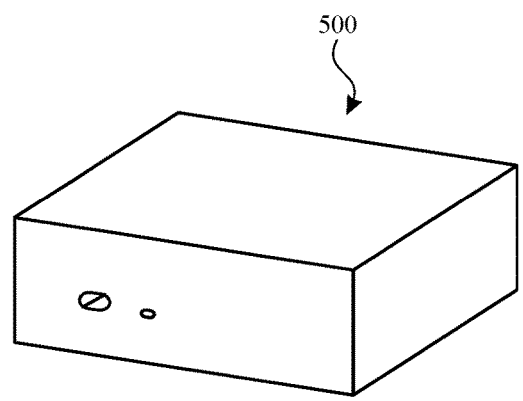

FIG. 14A illustrates a perspective view of an electronic device 200 that takes the form of a mobile wireless communication device, such as a smartphone. FIG. 14B illustrates a perspective view of an electronic device 300 that takes the form of a mobile wireless communication device, such as a tablet computing device. FIG. 14C illustrates a perspective view of an electronic device 400 that takes the form of a standalone display device or a desktop computing device with a display. FIG. 14D illustrates a perspective view of an electronic device 500 that takes the form of a standalone desktop computing device, including a compact desktop computing device. Accordingly, the features shown and described for an assembly, a standoff, and a circuit board may be present in computing devices with or without displays. Electronic device 100 (shown in FIG. 1) and electronic devices shown in FIGS. 14A-14D are not intended to be a comprehensive set of electronic devices, and other electronic devices are possible.

Figure 15:
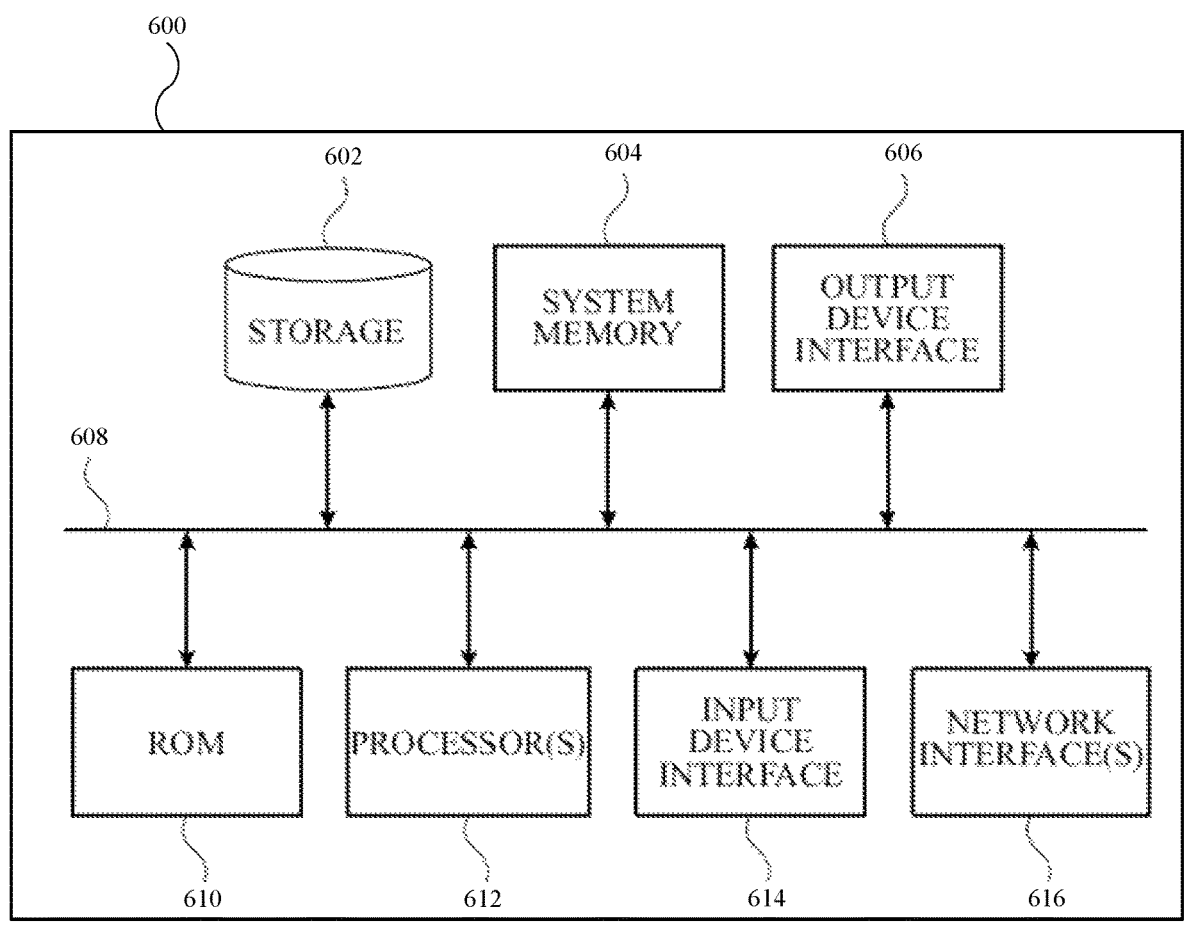
FIG. 15 illustrates a block diagram of an electronic system with which one or more implementations of the subject technology may be implemented.

FIG. 15 illustrates an electronic system 600 with which one or more implementations of the subject technology may be implemented. Electronic system 600 can be electronic device 100 as shown in FIG. 1 or any one of electronic devices 200, 300, 400, and 500 shown in FIGS. 14A-14D, respectively. Electronic system 600 may include various types of computer readable media and interfaces for various other types of computer readable media. Electronic system 600 includes a bus 608, one or more processing unit(s) 612, a system memory 604 (and/or buffer), a ROM 610, a permanent storage device 602, an input device interface 614, an output device interface 606, and one or more network interfaces 616, or subsets and variations thereof.

Bus 608 collectively represents all system, peripheral, and chipset buses that communicatively connect the numerous internal devices of electronic system 600. In one or more implementations, bus 608 communicatively connects one or more processing unit(s) 612 with ROM 610, system memory 604, and permanent storage device 602. From these various memory units, one or more processing unit(s) 612 retrieves instructions to execute and data to process in order to execute the processes of the subject disclosure. One or more processing unit(s) 612 can be a single processor or a multi-core processor in different implementations.

ROM 610 stores static data and instructions that are needed by one or more processing unit(s) 612 and other modules of electronic system 600. Permanent storage device 602, on the other hand, may be a read-and-write memory device. Permanent storage device 602 may be a non-volatile memory unit that stores instructions and data even when electronic system 600 is off. In one or more implementations, a mass-storage device (such as a magnetic or optical disk and its corresponding disk drive) may be used as permanent storage device 602.

In one or more implementations, a removable storage device (such as a floppy disk, flash drive, and its corresponding disk drive) may be used as permanent storage device 602. Like permanent storage device 602, system memory 604 may be a read-and-write memory device. However, unlike permanent storage device 602, system memory 604 may be a volatile read-and-write memory, such as random access memory. System memory 604 may store any of the instructions and data that one or more processing unit(s) 612 may need at runtime. In one or more implementations, processes of the subject disclosure are stored in system memory 604, permanent storage device 602, and/or ROM 610 (which are each implemented as a non-transitory computer-readable medium). From these various memory units, one or more processing unit(s) 612 retrieves instructions to execute and data to process in order to execute the processes of one or more implementations.

Bus 608 also connects to input device interface 614 and output device interface 606. Input device interface 614 enables a user to communicate information and select commands to the electronic system 600. Input devices that may be used with input device interface 614 may include, for example, alphanumeric keyboards and pointing devices (also called "cursor control devices"). Output device interface 606 may enable, for example, the display of images generated by electronic system 600. Output devices that may be used with the output device interface 606 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 15, bus 608 is also capable of coupling electronic system 600 to one or more networks and/or to one or more network nodes through the one or more network interface(s) 616. In this manner, electronic system 600 can be a part of a network of computers, such as a local area network (LAN), a wide area network (WAN), or a network of networks, such as the Internet. Any or all components of electronic system 600 can be used in conjunction with the subject disclosure.

Accordingly, embodiments of the present disclosure provide an assembly that can provide enhanced thermal transport capabilities by having a shape larger than that of a circuit board on which the assembly is disposed. The assembly further provides a robust metal component (i.e., metal layer) that provides stiffness to the circuit board as well as EMI shielding. Also, the assembly can secure with a standoff by way of a mechanical, metal-to-metal contact, thus eliminating the need for adhesives and tape. Additionally, a standoff of the assembly is modified to receive fasteners that assist in securing perimeter connectors on the circuit board, resulting in more space on the circuit board.

Various examples of aspects of the disclosure are described below as clauses for convenience. These are provided as examples, and do not limit the subject technology.

Clause A: An assembly including: a standoff disposed on a perimeter of a circuit board; and a thermal module mechanically coupled with the standoff, the thermal module including: a first portion that covers a heat-generating component of the circuit board, and a second portion that extends laterally beyond the standoff.

Clause B: A circuit board assembly including: a circuit board; a standoff coupled to the circuit board, the standoff including: a receiving surface, and a first extension and a second extension, wherein the first extension and the second extension extend from the receiving surface; and a thermal module that covers the receiving surface, the thermal module including a protruding element located between the first extension and the second extension.

Clause C: A portable electronic device including: a display housing that carries a display; and a base portion rotationally coupled with the display housing, the base portion including: a circuit board that carries a heat-generating component; a standoff disposed on a perimeter of the circuit board; and a thermal module mechanically coupled with the standoff, the thermal module including: a metal layer in contact with the standoff, a first portion that covers the heat-generating component, and a second portion that extends laterally beyond the standoff Clause D: An electronic device including: a housing that includes an internal chamber; and components located in the internal chamber, the components including: a circuit board that carries a heat-generating component; a metal standoff disposed on a perimeter of the circuit board, the metal layer including an opening; and a thermal module mechanically coupled with the standoff, the thermal module including: a metal layer including a protruding element positioned in the opening, the metal layer includes an embossed region, a non-metal layer disposed on the embossed region, a first portion that covers the heat-generating component, and a second portion that extends laterally beyond the standoff.

One or more of the above clauses can include one or more of the features described below. It is noted that any of the following clauses may be combined in any combination with each other, and placed into a respective independent clause, e.g., clause A, B, C or D.

Clause 1: wherein: the first portion is configured to dissipate thermal energy from the heat-generating component, and the second portion is configured to receive at least some of the thermal energy from the first portion.

Clause 2: wherein the thermal module includes a plurality of extensions that separates the first portion from the second portion.

Clause 3: further including a bracket secured with the thermal module at the second portion.

Clause 4: wherein: the bracket includes a bend, and the bracket is configured to secure with a keyboard circuit board along the bend.

Clause 5: wherein the thermal module includes: a non-metal layer; an electrical insulator; and a metal layer positioned between the non-metal layer and the electrical insulator.

Clause 6: wherein: the metal layer includes a recessed region; and the non-metal layer is disposed on the recessed region.

Clause 7: wherein the first extension and the second extension engage the circuit board.

Clause 8: further including a bracket secured with the thermal module and the circuit board.

Clause 9: wherein the bracket is outside a perimeter defined by the standoff.

Clause 10: wherein the thermal module includes a metal layer, including: a plurality of protruding elements, each of which is positioned between respective extensions of the standoff; and a plurality of extensions that engage the circuit board.

Clause 11: wherein the thermal module: a first portion that covers the circuit board; and a second portion that extends laterally with respect to the first portion, the circuit board uncovered by the second portion, and the plurality of extensions separates the first portion from the second portion.

Clause 12: wherein the thermal module contacts the receiving surface.

Clause 13: wherein: the standoff includes: a receiving surface, and a first extension and a second extension, wherein the first extension and the second extension extend from the receiving surface, wherein the thermal module covers the receiving surface and includes an indentation located between the first extension and the second extension.

Clause 14: further including: a keyboard circuit board located in the base portion; and a shield secured with the keyboard circuit board, wherein the circuit board is positioned between the thermal module and the shield.

Clause 15: further including a fastener, wherein the standoff includes a threaded portion that receives the fastener.

Clause 16: further including: a power source; a flexible circuit electrically coupled to the power source; a connector that electrically couples the flexible circuit to the circuit board; and a cowling that secures the flexible circuit to the circuit board, wherein the fastener includes a fastener head that engages the cowling and the thermal module.

Clause 17: wherein the thermal module includes: a non-metal material; and a metal material, wherein the fastener head engages the metal material.

Clause 18: wherein: the first portion is configured to dissipate thermal energy from the heat-generating component, and the second portion is configured to receive at least some of the thermal energy from the first portion.

Clause 19: further including a bracket secured with the thermal module at the second portion, wherein the bracket is located laterally with respect to the metal standoff Clause 20: wherein the metal layer contacts and overlaps the metal standoff Clause 21: wherein the thermal module includes a plurality of extensions that separates the first portion from the second portion.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other embodiments. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An assembly comprising:
   a standoff disposed on a perimeter of a circuit board; and
   a thermal module mechanically coupled with the standoff, the thermal module comprising:
      a first portion that covers a heat-generating component of the circuit board, and
      a second portion that extends laterally beyond the standoff; and
   a bracket coupled with the thermal module at the second portion, the bracket comprising a bend, wherein the bracket is configured to secure with a component based on the bend.

2. The assembly of claim 1, wherein:
   the first portion is configured to dissipate thermal energy from the heat-generating component, and
   the second portion is configured to receive at least some of the thermal energy from the first portion.

3. The assembly of claim 1, wherein the thermal module comprises a plurality of extensions that separates the first portion from the second portion.

4. The assembly of claim 1, wherein the thermal module comprises:
   a non-metal layer;
   an electrical insulator; and
   a metal layer positioned between the non-metal layer and the electrical insulator.

5. The assembly of claim 4, wherein:
   the metal layer comprises a recessed region; and
   the non-metal layer is disposed on the recessed region.

6. The assembly of claim 1, further comprising a shield secured with the component.

7. A circuit board assembly comprising:
   a circuit board;
   a standoff coupled to the circuit board, the standoff comprising:
      a receiving surface, and
      a first extension and a second extension, wherein the first extension and the second extension extend from the receiving surface; and
   a thermal module that covers the receiving surface, the thermal module comprising:
      a non-metal layer,
      an electrical insulator, and
      a metal layer positioned between the non-metal layer and the electrical insulator.

8. The circuit board assembly of claim 7, wherein the first extension and the second extension engage the circuit board.

9. The circuit board assembly of claim 7, further comprising a bracket secured with the thermal module and the circuit board.

10. The circuit board assembly of claim 9, wherein the bracket is outside a perimeter defined by the standoff.

11. The circuit board assembly of claim 7, wherein the metal layer further comprises:
    a plurality of protruding elements, each of which is positioned between respective extensions of the standoff; and
    a plurality of extensions that engage the circuit board.

12. The circuit board assembly of claim 11, wherein the thermal module:
    a first portion that covers the circuit board; and
    a second portion that extends laterally with respect to the first portion, the circuit board uncovered by the second portion, and
    the plurality of extensions separates the first portion from the second portion.

13. The circuit board assembly of claim 7, wherein the thermal module contacts the receiving surface.

14. A portable electronic device comprising:
    a display housing that carries a display; and
    a base portion rotationally coupled with the display housing, the base portion comprising:
       a circuit board that carries a heat-generating component, the circuit board comprising a perimeter;
       a standoff disposed on the perimeter of the circuit board, the standoff comprises a first extension, a second extension, and an opening between the first extension and the second extension; and
       a thermal module mechanically coupled with the standoff, the thermal module comprising:
          a metal layer in contact with the standoff, the metal layer comprising a protruding element positioned in the opening,
          a first portion that covers the heat-generating component, and
          a second portion that extends laterally beyond the standoff.

15. The portable electronic device of claim 14, wherein:
    the standoff comprises:
       a receiving surface,
    wherein the first extension and the second extension extend from the receiving surface, and the thermal module covers the receiving surface and includes an indentation located between the first extension and the second extension.

16. The portable electronic device of claim 14, further comprising:
    a keyboard circuit board located in the base portion; and
    a shield secured with the keyboard circuit board, wherein the circuit board is positioned between the thermal module and the shield.

17. The portable electronic device of claim 14, further comprising a fastener, wherein the standoff comprises a threaded portion that receives the fastener.

18. The portable electronic device of claim 17, further comprising:
    a power source;
    a flexible circuit electrically coupled to the power source;
    a connector that electrically couples the flexible circuit to the circuit board; and a cowling that secures the flexible circuit to the circuit board, wherein the fastener comprises a fastener head that engages the cowling and the thermal module.

19. The portable electronic device of claim 18, wherein the thermal module comprises:
a non-metal material; and
a metal material, wherein the fastener head engages the metal material.

20. The portable electronic device of claim 14, wherein the thermal module further comprises:
a non-metal layer; and
an electrical insulator, wherein the metal layer, the non-metal layer and the electrical insulator define the first portion and the second portion.

21. An electronic device comprising:
a housing that includes an internal chamber; and
components located in the internal chamber, the components comprising:
  a circuit board that carries a heat-generating component;
  a metal standoff disposed on a perimeter of the circuit board, the metal standoff comprising an opening; and
  a thermal module mechanically coupled with the metal standoff, the thermal module comprising:
    a metal layer comprising a protruding element positioned in the opening, wherein the metal layer comprises an embossed region,
    a non-metal layer disposed on the embossed region,
    a first portion that covers the heat-generating component, and
    a second portion that extends laterally beyond the metal standoff.

22. The electronic device of claim 21, wherein:
the first portion is configured to dissipate thermal energy from the heat-generating component, and
the second portion is configured to receive at least some of the thermal energy from the first portion.

23. The electronic device of claim 21, further comprising a bracket secured with the thermal module at the second portion, wherein the bracket is located laterally with respect to the metal standoff.

24. The electronic device of claim 21, wherein the metal layer contacts and overlaps the metal standoff.

25. The electronic device of claim 21, wherein the thermal module comprises a plurality of extensions that separates the first portion from the second portion.

* * * * *